United States Patent
Zhang

(10) Patent No.: US 6,717,974 B2
(45) Date of Patent: Apr. 6, 2004

(54) APPARATUS AND METHOD FOR IMPROVING ELECTRICAL CONDUCTION STRUCTURE OF A VERTICAL CAVITY SURFACE EMITTING LASER

(75) Inventor: Xiaobo Zhang, Arcadia, CA (US)

(73) Assignee: Lumei Optoelectronics Corporation, El Monte, CA (US)

( * ) Notice: Subject to any disclaimer, the term of this patent is extended or adjusted under 35 U.S.C. 154(b) by 0 days.

(21) Appl. No.: 10/113,487

(22) Filed: Apr. 1, 2002

(65) Prior Publication Data

US 2003/0185268 A1 Oct. 2, 2003

(51) Int. Cl.[7] .................................................. H01S 3/08
(52) U.S. Cl. ............................... 372/96; 372/46; 372/45
(58) Field of Search ............................... 372/96, 46, 45; 257/96; 438/39, 45

(56) References Cited

U.S. PATENT DOCUMENTS

| | | | | |
|---|---|---|---|---|
| 5,256,596 A | * | 10/1993 | Ackley et al. ................ 438/39 |
| 5,764,674 A | * | 6/1998 | Hibbs-Brenner et al. ..... 372/46 |
| 5,893,722 A | * | 4/1999 | Hibbs-Brenner et al. ..... 438/45 |
| 6,144,682 A | | 11/2000 | Sun | |
| 6,256,333 B1 | * | 7/2001 | Johnson ........................ 372/96 |
| 6,459,719 B1 | * | 10/2002 | Johnson ........................ 372/96 |
| 6,483,127 B2 | * | 11/2002 | Saeki ............................ 257/96 |
| 6,522,680 B1 | * | 2/2003 | Johnson ........................ 372/96 |

* cited by examiner

*Primary Examiner*—Paul Ip
*Assistant Examiner*—Tuan N. Nguyen
(74) *Attorney, Agent, or Firm*—Jean C. Edwards; Dickinson Wright PLLC

(57) ABSTRACT

A heavily doped semiconductor layer is formed over the barrel of a vertical cavity surface emitting laser (VCSEL), providing current conduction and current spreading across and into the aperture of a laser barrel, while eliminating the need for a light-obstructing conductive electrical contact overhang. The VCSEL comprises a substrate, a first distributed Bragg reflector (DBR), an active region, a second DBR having a non-conductive ion implantation region and a laser barrel region with a first diameter, the heavily doped semiconductor layer, and a conductive electrical contact. The conductive electrical contact defines an opening with a second diameter that is greater than the first diameter.

19 Claims, 3 Drawing Sheets even current flow into the barrel region of the VCSEL. Again, the opening 165 defined by the upper metal contact 125 determines the VCSEL aperture size, thereby restricting the aperture size.

APPARATUS AND METHOD FOR IMPROVING ELECTRICAL CONDUCTION STRUCTURE OF A VERTICAL CAVITY SURFACE EMITTING LASER

FIELD

The present invention relates to vertical cavity surface emitting lasers ("VCSELs"). More particularly, the present invention relates to VCSELs having improved electrical conduction properties and their method of manufacture and operation.

BACKGROUND

Vertical cavity surface emitting lasers ("VCSELs") are ideal sources for two-dimensional array applications such as optical scanners, displays, computer interconnects, signal processing and optical data storage. VCSELs also find applications as light sources in computing equipment, laser printers, consumer electronics systems, active optical components and communications applications. Compared with other semiconductor laser technologies, such as edge emitter lasers, VCSELs are increasingly preferred because they emit light having a circular anastigmatic beam and relatively limited angular divergence. On the other hand, the laser beam from an edge-emitter laser tends to be asymmetric. In addition, VCSELs are preferred to edge-emitter lasers because VCSEL light output emerges from the top of the structure in a beam normal to the semiconductor substrate, e.g., a wafer. This configuration favors cost-effective wafer-scale testing and the production of laser array devices, which is an increasingly popular device format in communications systems.

Conventional VCSELs typically produce a Gaussian output optical intensity distribution when the output power is limited, typically to less than 1 milliwatt (mW). When such a VCSEL is operated at a higher power level, the device exhibits multi-mode operation, and the optical output intensity pattern degrades to a multi-mode, doughnut-shaped distribution. Lenses are typically used to concentrate the output of a VCSEL to couple the light into an optical fiber or a waveguide, but the efficiency of these lenses is limited when the VCSEL operates in a multi-mode range.

In many of today's communications applications, VCSELs are required to operate in single mode. Optical and electrical power efficiency in single mode operation reduces the operating cost as well as heat dissipation complications. Heat dissipation is increasingly important as advances in the technology of communications systems increase demands for higher density integrated VCSEL arrays. Hence, VCSEL designers strive to produce lasers that emphasize single mode operation while minimizing higher mode output.

FIG. 1 shows a cross-sectional side view of a conventional VCSEL. The conventional VCSEL structure 10 comprises a semiconductor substrate 30, a vertical laser cavity 40 built on top of the semiconductor substrate 30, and two metal contacts 20, 25. The metal contacts 20, 25, generally opaque in nature, sandwich the entire substrate and the vertical laser cavity structure, one being on top of the vertical laser cavity 40 while the other being below the semiconductor substrate 30. The metal contact 25 is annular in shape and resembles a circular ring or an elliptical ring when viewed from top.

The vertical laser cavity 40 further comprises an n-distributed Bragg reflector (DBR) section 42, a p-DBR section 46, an active lasing section 44 sandwiched between the two DBR sections 42, 46, and a non-conductive implant material 48 surrounding a middle portion 47 of the p-DBR section 46. The non-conductive implant material 48 forms a conductive boundary wall 50 for the VCSEL structure 10. A cylinder that includes two parts defines a barrel region 52. The first part comprises the middle portion 47. The second part comprises a portion of the active lasing section 44 that is coaxially aligned with and has substantially the same cross-sectional configuration as the middle portion 47. This barrel region 52 has a diameter 60.

In operation, light is emitted from the active lasing section 44. A portion of the light energy tunnels through, first, the barrel region 52 and then through an opening/aperture 65 defined by the opaque upper metal contact 25. The diameter 60 of the barrel region is constrained by the need to provide good current conduction between the upper metal contact 25 and the barrel wall. This is true because the non-conductive boundary wall of the VCSEL structure 10 does not convey current between the metal contacts 20, 25. This constraint is usually addressed by creating a metal contact overhang 70 as an extension of metal contact 25 at the top of the VCSEL structure 10. As a result, the metal contact 25 on the top of the VCSEL structure 10 overhangs the barrel region. The opening/hole 65 defined by the metal contact overhang 70 sets the aperture diameter for the conventional VCSEL structure 10. Therefore, the device aperture of the conventional VCSEL structure 10 is necessarily smaller than the diameter 60 of the barrel region 52.

The metal contact overhang 70 obstructs light emitted from the barrel region 52, and thus limits output energy. The metal contact overhang 70 also causes inefficient current delivery to the barrel region 52. The current flow in the VCSEL structure 10 will hug the walls of the laser and induce relatively little lasing activity along the length of the VCSEL structure 10 to promote single mode operation.

Another challenge of VCSEL architecture posed by the upper contact overhang 70 is back scattering, which compounds the aforementioned inefficiency of the metal contact overhang 70. The upper metal contact overhang 70 blocks a portion of outbound light and reflects the light back into the laser barrel. This reflected or back-scattered light interferes constructively with outbound light in the barrel region and establishes a standing wave pattern that contributes significantly to inducing undesirable multi-mode output. The back scattering affect results in the multi-mode, donut-shaped output intensity pattern that is characteristic of a standard VCSEL.

Several VCSEL manufacturers have sought to reduce multi-mode output by filtering or blocking higher mode operation. Spatial absorptive filters and/or phase shift filters are integrated into this type of VCSEL. One example of such VCSEL is described in U.S. Pat. No. 6,144,682. FIG. 2 shows a cross-sectional side view of the VCSEL described in U.S. Pat. No. 6,144,682. This VCSEL exhibits an effort to reduce modal reflectivity for the higher order transverse modes of the emitted light from the active lasing section 144 of the VCSEL. This is accomplished by using thicker and thinner spatial absorptive and phase shift filter semiconductor layers 182, 180 between the p-DBR section 146 and upper metal contact 125. The VCSEL further utilizes a translucent, conductive Indium Tin Oxide layer 190 to assist electric current to flow through the p-DBR section 146 and into the active lasing section 144. However, the upper metal contact 125 is still required to extend into the barrel region of the VCSEL, as shown by region 170, to provide an even current flow from the upper metal contact 125 into the barrel region. Similar to FIG. 1, the diameter of the opening 165 defined by the upper metal contact 125 is smaller than the diameter 160 of the barrel region as confined by the non-conductive implant material 148. As a result, output light is obstructed, and undesirable back scattering occurs. Although filtering structure could somewhat compensate for the undesirable multi-mode output, the VCSEL as shown in FIG. 2 does not favor single mode operation.

SUMMARY

Aspects of the present invention relate to apparatus and methods for improving the current conduction structure of a VCSEL. A layer of heavily doped semiconductor material is disposed over the top surface of a distributed brag reflector (DBR) on top of the VCSEL structure. This material provides current conduction and current spreading across and into the aperture of the laser barrel. The current flow in the center of a laser barrel region is increased relative to the barrel walls, favoring single mode light production. The heavily doped semiconductor layer also eliminates conductive electrical contact overhang that obstructs, increasing output energy. Because the conductive electrical contact overhang is eliminated, scattered light is not reflected back into the barrel region of the laser, and the multi-mode light induction effect is minimized. This feature leads to improved emission efficiency and smaller diameter laser structure that favors single mode light operation at relatively high power.

DETAILED DESCRIPTION

Embodiments of the present invention are directed to apparatus and methods for improving the electrical conduction structure at the emitting end of a VCSEL. In one embodiment, a heavily doped semiconductor layer is re-grown over the barrel of a VCSEL laser to provide current conduction and current spreading across and into the aperture of the laser barrel. With the heavily doped semiconductor layer, current flow is increased in the center of the laser barrel relative to the barrel walls. Such current distribution increases the efficiency of light production in the center of the active region, where single mode light production is favored. The heavily doped semiconductor layer also eliminates the need for the conductive electrical contact to overhang the barrel portion of the VCSEL, which in turn minimizes light scattering effect that would be present if the conductive electrical contact overhang were to be there. Furthermore, embodiments of the present invention lead to the possible reduction of the diameter of the VCSEL, further favoring single mode operation at relatively high driving current and output power.

Figure 3:
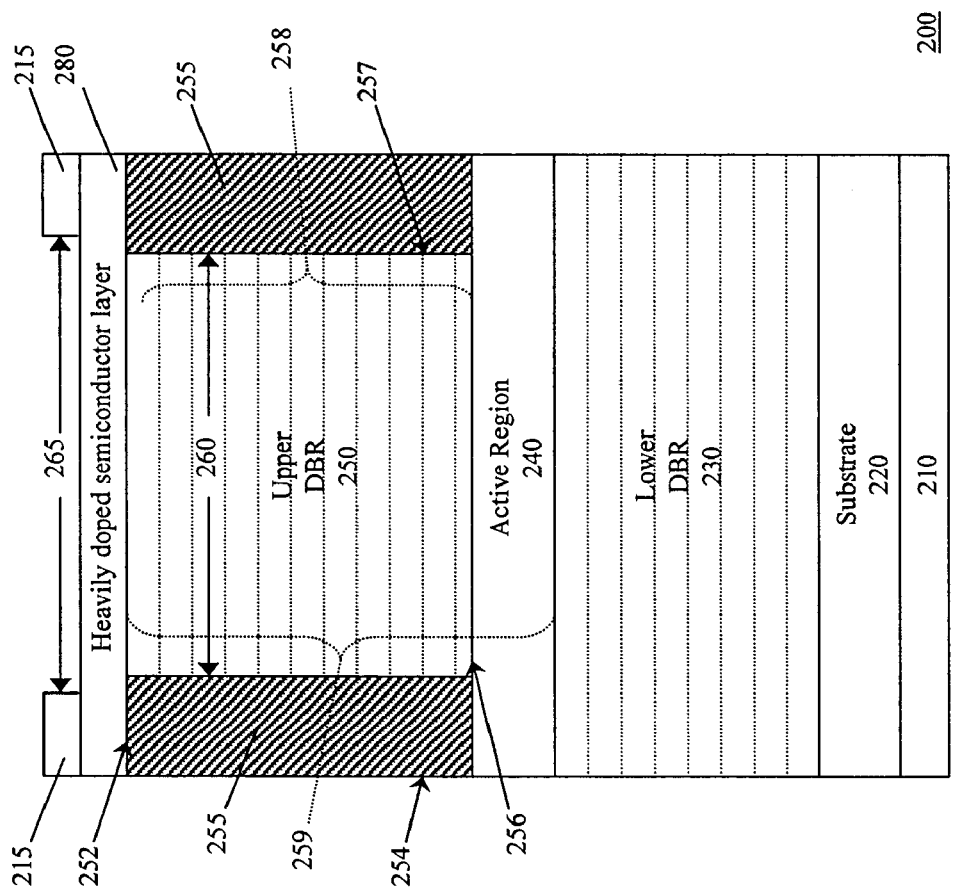
FIG. 3 illustrates a cross-sectional side view of a VCSEL constructed according to an embodiment of the present invention.

FIG. 3 illustrates a cross-sectional side view of a VCSEL structure 200 according to an embodiment of the present invention. In the embodiment, the VCSEL 200 comprises an electrically conductive lower contact 210, an electrically conductive upper contact 215, a substrate 220, a number of semiconductor layers formed on the substrate 220, and a heavily doped semiconductor layer 280. In one embodiment, one or more of the semiconductor layers form a lower DBR 230, one or more of the semiconductor layers form an active region 240, and one or more of the semiconductor layers form an upper DBR 250. A non-conducting ion implantation region 255 further defines a conductive boundary of the upper DBR 250.

In one embodiment, the heavily doped semiconductor layer 280 is a Gallium Arsenide (GaAs) re-growth layer. Other types of material may also be used, including, but not limited to, Indium Gallium Nitride (InGaN), Aluminum Gallium Arsenide (AlGaAs), and Indium Tin Oxide (ITO). In FIG. 3, the heavily doped semiconductor layer 280 is positioned between the DBR 250 and the electrically conductive upper contact 215. The heavily doped semiconductor layer 280 spreads enough current over and, into the entire laser aperture for operation and eliminates the need for conductive electrical contact overhang that would block outbound light.

The VCSEL structure 200 is a monolithic laser structure. It may be fabricated by a technique such as metalorganic chemical vapor deposition (MOCVD) as is well known in the art. Other deposition processes such as liquid phase epitaxy ("LPE"), molecular beam epitaxy ("MBE"), or other know crystal growth processes may also be used. In this embodiment with an n-type substrate, the VCSEL structure 200 comprises a substrate 220 of Gallium Arsenide that is about 100 microns thick and is doped with Silicon. In the less common case of a p-type substrate, Carbon is the dopant.

A lower DBR 230 is deposited on the substrate 220. The structure and implementation of DBRs is well understood in the art. In one implementation, the lower DBR 230 comprises many pairs of layers of AlGaAs with varying aluminum concentration in order to establish layers with alternating high and low indexes of refraction. Other types of material may also be used and another arrangement may also be used to form the lower DBR 230. For example, alternating layers of InP and InGaAsP are known to be effective materials for producing a DBR that is effective in the range of long wavelength light, such as 1.3 micron. Preferably, each layer has a quarter wavelength thickness where the operative wavelength is that of the emitted light of the VCSEL 200.

An active region 240 is deposited on the lower DBR 230. In one embodiment, the active region 240 comprises several layers of AlGaAs with varying levels of aluminum concentration including a center layer (not shown) that is void of aluminum content. Other types of material, well known to those skilled in the art, may alternatively be used, as well as a single layer arrangement may also be used to form the active region 240. An upper DBR 250 is deposited on the active region 240. The upper DBR 250 comprises a top surface 252, an outer wall 254 and a bottom surface 256. In one implementation, the upper DBR 250 comprises many layers of AlGaAs with varying aluminum concentration. Preferably, each layer has a quarter wavelength thickness where the operative wavelength is that of the emitted light of the VCSEL 200.

A non-conducting ion implantation region 255 is formed in the upper DBR 250 by deep implantation of, for example, H+, He+ or O+ ions through the top surface 252 of the upper DBR 250 by masking, a process that is known to those skilled in the art.

The ion implantation region 255 forms a laser barrel wall 257 and serves to electrically and optically confine the vertical laser cavity of the VCSEL 200. A reflective non-implanted portion 258 comprises that portion of the upper DBR that has not been implanted. A laser barrel region 259 comprises the non-implanted portion 258 and that portion of the active region 240 disposed directly below the non-implanted portion 258.

In this embodiment, the ion implantation region 255 is substantially annular in shape and circumferentially surrounds the non-implanted portion 258 of the upper DBR 250. The diameter 260 of the non-implanted portion 258 defines the diameter of the laser barrel and the laser cavity.

Although an annularly configured ion implantation region 255 is illustrated above, it is noted that the ion implantation region 255 may be of another shape, as long as the region confines and defines a conductive boundary of the upper DBR 250.

Figure 2:
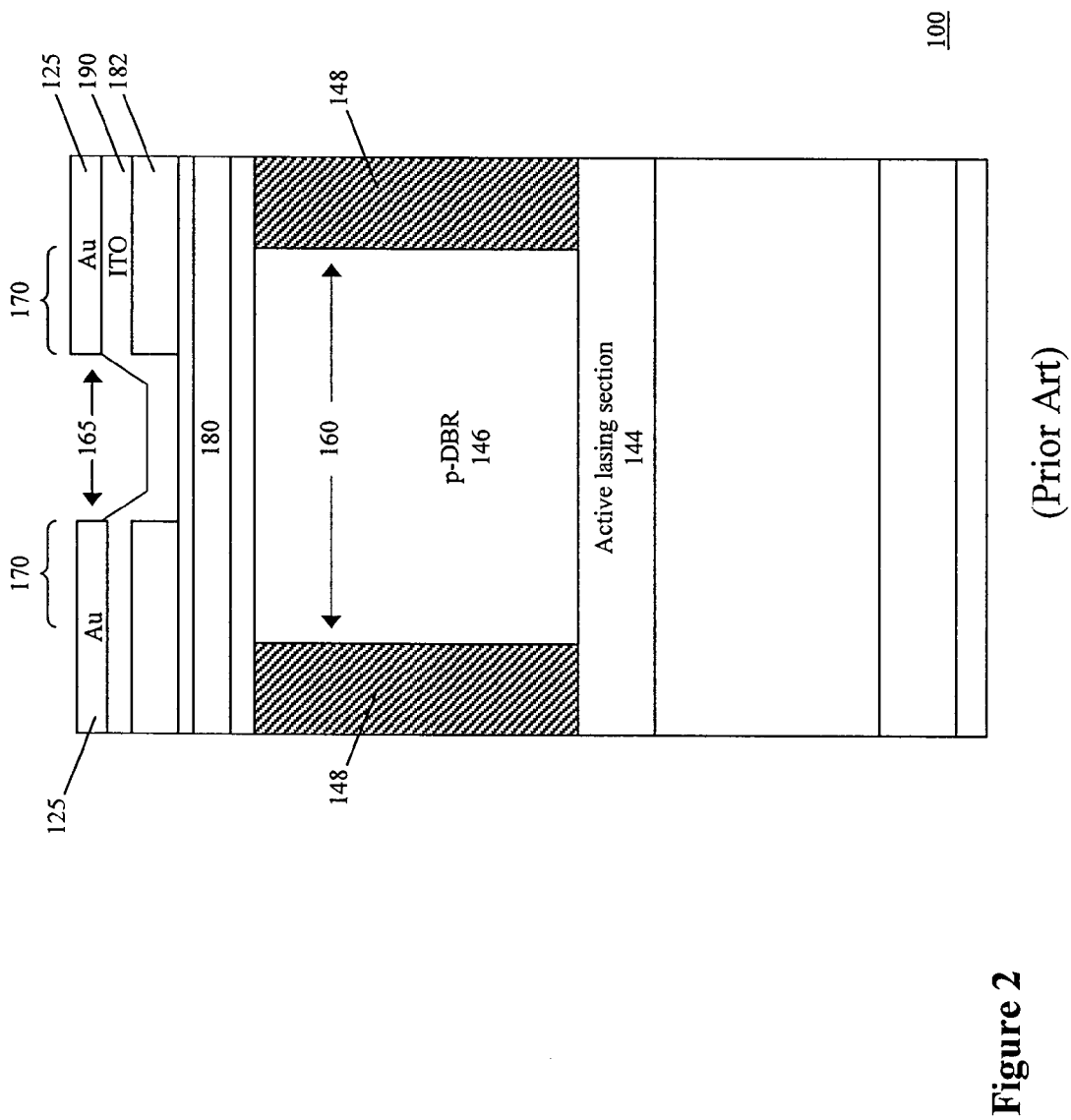
FIG. 2 shows a cross-sectional side view of a second conventional VCSEL.

In FIG. 2, a heavily doped semiconductor layer 280 is deposited over the entire top surface 252 of the upper DBR 250. Thus, the heavily doped semiconductor layer 280 spans the diameter of the laser barrel and extends to cover the entire upper DBR 250.

The heavily doped semiconductor material, of which layer 280 is formed, is substantially optically transparent to output of the VCSEL 200 and is comprised of materials that allow for current conduction into the non-implanted portion 258 of the upper DBR 250. Such materials may include GaAs, InGaN, AlGaAs or other materials selected based upon the materials in the upper DBR 250, the selection and doping of which enable current flow include parameters well known to those skilled in the art.

The heavily doped semiconductor layer 280 provides the required physical contact with the upper contact 215, while the doping provides the required electrical conductivity between the upper contact 215 and the barrel region 259. The doping of the heavily doped semiconductor layer 280 imposes substantially even current distribution over the aperture of the VCSEL 200. As a result, charge carriers flow evenly through the center of the laser barrel and through the center of the active region 240 of the laser, where single mode operation is favored.

In one embodiment, the heavily doped semiconductor layer 280 is created by first forming a layer over the upper DBR 250, and then heavily doping the layer to create the heavily doped semiconductor layer 280. Alternatively, previously doped material may be directly deposited over the upper DBR 250.

There are other ways to set up a similar configuration. For example, a GaAs re-growth layer is formed first, and the re-growth layer is doped with carbon, zinc, or beryllium, in the case of an n-type substrate being used. Depending on the material being used or the specific characteristics desired, other dopants may be utilized to provide similar benefit. For example, if the device has a p-type substrate, silicon may be a dopant candidate.

It is noted that the heavily doped semiconductor layer 280 is not limited to a highly doped sample of the same compound semiconductor that comprises the cap layer of the VCSEL. In other embodiments, it may be any lattice-matched or pseudomorphic semiconductor layer that is grown on top of the cap layer—e.g., GaAs, AlGaAs, InGaN. Additionally, the heavily doped semiconductor layer may be supplemented by a transparent metal layer—e.g., an Indium Tin Oxide layer—to enhance the high power operation of single mode VCSELs.

The heavily doped semiconductor layer 280 should be thin enough such that energy absorption is minimal. Preferably, the thickness of the heavily doped semiconductor layer 280 is equal or substantially equal to an odd multiple of a quarter wavelength of the intended VCSEL output light. In this case, the heavily doped semiconductor layer 280 contributes to coherent light transmission as well as constructive light reflection into the laser barrel. As a result, the heavily doped semiconductor layer 280 serves as the top layer of the upper DBR 250. In the current embodiments, a heavily doped semiconductor layer 280 that is at least as thick as three-quarters of the output wavelength has proven to be an effective element of the DBR 250 without incurring undesirable light absorption or impractical manufacturing difficulty. Other thicknesses, such as five-quarter wavelengths, seven-quarters, nine-quarters, and so on, would also be effective.

The electrically conductive upper contact 215 is formed on the heavily doped semiconductor layer 280. A conductive electrical contact may also be referred to as a contact layer or a device electrode. The heavily doped semiconductor layer 280 provides electrical and physical contact to the upper contact 215 and provides efficient current flow from the upper contact 215 into the barrel region of the VCSEL 200. The doping of the heavily doped semiconductor layer 280 assures that current flowing into the VCSEL device 200 from the upper contact 215 will flow efficiently throughout and into the entire aperture of the laser barrel region 259.

Figure 1:
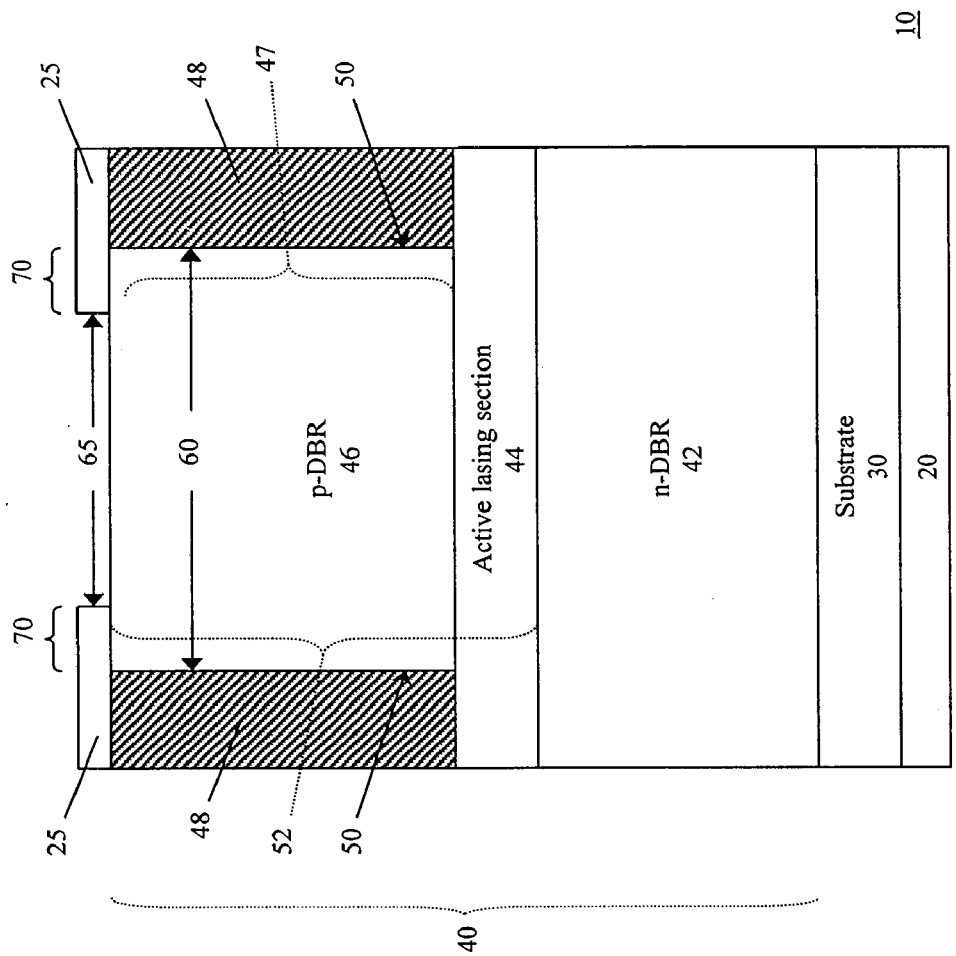
FIG. 1 shows a cross-sectional side view of a first conventional VCSEL.

Due to the presence of the heavily doped semiconductor layer 280, it is not necessary to provide an upper contact that covers part of the conductive upper DBR 250, i.e., overhangs part of the laser barrel. In other words, the upper contact 215 is formed without any aperture-limiting overhang that obstructs output light emitted from the laser barrel region and limits the laser diameter. As a result, the many obstacles of a conventional upper conductor configuration shown in FIGS. 1 and 2 are avoided by the VCSEL structure 200 having the heavily doped semiconductor layer 280 and the upper contact 215 with diameter 265.

On the side opposite to the electrically conductive upper contact 215, the electrically conductive lower contact 210 is formed on the substrate 220. The lower contact 210 is formed on the side opposite from the lower DBR 230.

Both of the upper and lower contacts 210, 215 may be formed using masking techniques as are known in the art. In one embodiment, the upper and lower contacts 210, 215 are preferably made of metal, such as gold, titanium, gold/germanium, or the like. Other types of material, well known for such use, may also be used.

The masking of the upper contact 215 forms an opening with a diameter 265. The diameter 265 of the opening is greater than that of the laser barrel region 259, i.e., diameter 260, formed in the upper DBR 250 by the aforementioned creation of the ion implantation region 255. The doping of the heavily doped semiconductor layer 280 is sufficient to conduct current from the upper contact 215 over the edge of the non-conductive laser barrel wall 257 into the barrel region 259 without a contact overhang.

In operation, when a voltage is applied across the upper and lower contacts 210, 215, lasing occurs in the active region 240 as photons race back and forth between the two sandwiching DBRs 230, 250. Light is produced from the active region 240 when it is biased. A portion of the light energy tunnels through the upper DBR 250 and through the opening defined by the upper contact 215. Because the VCSEL 200 does not include the contact overhangs of the conventional VCSELs of FIGS. 1 and 2, the diameter 260 of the non-implanted portion 258, which is also the diameter of the laser barrel region 259, defines the aperture diameter of the laser barrel and the laser cavity as well. Consequently, the upper contact 215 does not block any of the outbound light generated in the laser barrel region. Further, the upper conductor 215 does not substantially scatter any light back into the laser barrel region, which can induce multi-mode light production. Finally, because the upper contact 215 does not define the laser barrel aperture, the upper conductor 215 does not determine a minimum diameter of the laser barrel.

Many advantages are intrinsic to embodiments of the present invention of providing apparatuses and methods that improves the electrical conduction structure at the emitting end of a VCSEL. The optical output efficiency is improved by reducing occlusion through the use of an electrical conduction structure that provides required physical and electrical bonding to the electrically conductive upper contact while eliminating the need for the contact to overhang the top of the barrel region. This is achieved by a combination of a heavily doped semiconductor layer and a non-overhanging electrically conductive upper contact, which eliminates optical aperture obstruction that is imposed by the conduction structure of the conventional VCSEL shown in FIGS. 1 and 2. The heavily doped semiconductor layer 280 also provides superior current spreading across the cross sectional area of the laser aperture and through the active region, which favors the single mode operation that communication system developers prefer.

In eliminating the need for a light-obstructing metal contact overhang and by utilizing a heavily doped semiconductor layer, a VCSEL that naturally favors single mode operation is realized. A naturally favored single mode operation VCSEL is inherently more efficient and commercially desirable as it would expend less energy producing undesirable higher mode light, and the manufacturing of such VCSEL is less complicated. Specifically, the manufacturing processes in building such a VCSEL is simplified through the reduction of production steps. For example, the architecture of the VCSELs according to embodiments of the present invention not only eliminates problems created by a contact overhang, but also can require fewer manufacturing steps than the prior art VCSEL shown in FIG. 2. Thus, greater efficiency is achieved.

As an added benefit of the elimination of the upper metal contact overhanging the laser barrel region, the VCSEL of the present invention is able to be manufactured with a smaller barrel diameter than the prior art VCSEL structures shown in FIGS. 1 and 2. With a narrower laser barrel region, the VCSEL of the present invention may be made to provide superior single mode performance and efficiency, e.g., single optical mode emission at relatively high power. For example, a narrower VCSEL laser less than 10 $\mu$m in diameter, which is feasible with the new upper contact arrangement, tends to favor single mode operation.

It should be emphasized that the above-described embodiments of the invention are merely possible examples of implementations set forth for a clear understanding of the principles of the invention. They are not intended to be exhaustive or to limit the invention to the precise forms disclosed. Variations and modifications may be made to the above-described embodiments of the invention without departing from the spirit and principles of the invention. For example, the same concept of the heavily doped semiconductor layer may be applied to a normal p-i-n structure grown on an n-type substrate, an n-i-p structure grown on a p-type substrate, or either structure grown on a semi-insulating substrate. The same concept of the heavily doped semiconductor layer may also be applied to other types of VCSEL material system, as well as both singlet and array devices. All such modifications and variations are intended to be included herein within the scope of the invention and protected by the following claims.

What is claimed is:

1. A surface emitting laser for emitting coherent light comprising:
    a substrate;
    a plurality of semiconductor layers formed on said substrate,
    said plurality of the-semiconductor layers including:
        a first distributed Bragg reflector (DBR) formed on said substrate,
        an active region formed on said first DBR,
        a second DBR including a laser barrel region through which coherent light can pass, formed on said active region; and
        a non-conducting ion implantation region defining a conductive boundary of the laser barrel region of the second DBR;
    a heavily doped semiconductor layer formed on the second DBR and the non-conducting ion implantation region;
    a first conductive electrical contact formed below the substrate; and
    a second conductive electrical contact formed directly on the heavily doped semiconductor layer, both the conductive electrical contacts enabling biasing of said active region to emit coherent light,
    wherein a combination of the heavily doped semiconductor layer and the second conductive electrical contact provides current flow through the surface emitting laser without obstructing coherent light emitted from the laser barrel region.

2. The surface emitting laser in accordance with claim 1, wherein the heavily doped conductive layer is heavily doped with at least one of Gallium Arsenide, Indium Gallium Nitride, and Aluminum Gallium Arsenide.

3. The surface emitting laser in accordance with claim 1, wherein the laser barrel region has a diameter less than 10 microns.

4. The surface emitting laser in accordance with claim 1, wherein said heavily doped semiconductor layer has a thickness substantially equal to an odd number multiple of quarter wavelengths of a desired output light.

5. The surface emitting laser in accordance with claim 4, wherein the heavily doped conductive layer is heavily doped with at least one of Gallium Arsenide, Indium Gallium Nitride, and Aluminum Gallium Arsenide.

6. The surface emitting laser in accordance with claim 4, wherein the laser barrel region has a diameter less than 10 microns.

7. A surface emitting laser for emitting coherent light comprising:
    a substrate;
    a first distributed Bragg reflector (DBR) formed on said substrate;
    an active region formed on said first DBR; a second DBR formed on said active region, the second DBR having a non-conducting ion implantation region and a laser barrel region, the laser barrel region having a first diameter;
    a heavily doped semiconductor layer formed on the second DBR and the non-conducting ion implantation region; and
    a conductive electrical contact disposed directly on the heavily doped semiconductor layer, the conductive electrical contact defining an opening with a second diameter, the second diameter being greater than the first diameter.

8. The surface emitting laser in accordance with claim 7, wherein the heavily doped conductive layer is heavily doped with at least one of Gallium Arsenide, Indium Gallium Nitride, and Aluminum Gallium Arsenide.

9. The surface emitting laser in accordance with claim 7, wherein the first diameter is less than 10 microns.

10. The surface emitting laser in accordance with claim 7, wherein said heavily doped semiconductor layer has a thickness substantially equal to an odd number multiple of quarter wavelengths of a desired output light.

11. The surface emitting laser in accordance with claim 7, wherein the heavily doped conductive layer is heavily doped with at least one of Gallium Arsenide, Indium Gallium Nitride, and Aluminum Gallium Arsenide.

12. The surface emitting laser in accordance with claim 10, wherein the first diameter is less than 10 microns.

13. A method of providing surface emitting laser that emits coherent light, the method comprising:
    providing a substrate;
    forming a first distributed Bragg reflector (DBR) on said substrate;
    forming an active region on said first DBR;
    forming a second DBR on said active region, the second DBR having a non-conducting ion implantation region and a laser barrel region, the laser barrel region having a first diameter;
    forming a heavily doped semiconductor layer on the second DBR and the non-conducting ion implantation region; and
    providing a conductive electrical contact positioned directly on top of the heavily doped semiconductor layer, the conductive electrical contact defining an opening with a second diameter, the second diameter being greater than the first diameter.

14. The method of claim 13, wherein a combination of the heavily doped semiconductor layer and the conductive electrical contact provides current flow through the surface emitting laser without obstructing coherent light emitted from the laser barrel region.

15. The method of claim 13, wherein the heavily doped conductive layer is heavily doped with at least one of Gallium Arsenide, Indium Gallium Nitride, and Aluminum Gallium Arsenide.

16. The method of claim 13, wherein the first diameter is reduced to less than 10 microns to produce single mode optical output while minimizing multi-mode output.

17. The method of claim 13, wherein said heavily doped semiconductor layer has a thickness substantially equal to an odd number multiple of quarter wavelengths of a desired output light.

18. The surface emitting laser in accordance with claim 17, wherein the heavily doped conductive layer is heavily doped with at least one of Gallium Arsenide, Indium Gallium Nitride, and Aluminum Gallium Arsenide.

19. The surface emitting laser in accordance with claim 17, wherein the first diameter is reduced to less than 10 microns to produce single mode optical output while minimizing multi-mode output.

* * * * *